(12) United States Patent
Kim et al.

(10) Patent No.: US 10,622,312 B2
(45) Date of Patent: Apr. 14, 2020

(54) SEMICONDUCTOR CHIPS AND SEMICONDUCTOR PACKAGES INCLUDING THE SAME

(71) Applicant: Samsung Electronics Co., Ltd., Suwon-si, Gyeonggi-do (KR)

(72) Inventors: Myoung-soo Kim, Hwaseong-si (KR); Seong-sik Min, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 73 days.

(21) Appl. No.: 16/100,927

(22) Filed: Aug. 10, 2018

(65) Prior Publication Data

US 2019/0229065 A1    Jul. 25, 2019

(30) Foreign Application Priority Data

Jan. 22, 2018  (KR) .................. 10-2018-0007893

(51) Int. Cl.
*H01L 23/544* (2006.01)
*H01L 23/52* (2006.01)
(Continued)

(52) U.S. Cl.
CPC ........ *H01L 23/544* (2013.01); *G02F 1/13452* (2013.01); *H01L 23/528* (2013.01); *H01L 23/562* (2013.01); *H01L 24/06* (2013.01); *H01L 29/0649* (2013.01); *H01L 24/05* (2013.01); *H01L 24/13* (2013.01); *H01L 24/16* (2013.01); *H01L 24/32* (2013.01); *H01L 24/73* (2013.01); *H01L 24/81* (2013.01); *H01L 24/83* (2013.01); *H01L 2224/0401* (2013.01); *H01L 2224/05554* (2013.01); *H01L 2224/06135* (2013.01); *H01L 2224/131* (2013.01); *H01L 2224/16225* (2013.01); *H01L 2224/46* (2013.01); *H01L 2224/48092* (2013.01);
(Continued)

(58) Field of Classification Search
CPC ... H01L 23/544; H01L 23/528; H01L 23/562; H01L 24/06; H01L 29/0649; H01L 2224/46; H01L 2224/48092; H01L 2224/48095; H01L 2224/48096; H01L 2224/48097; H01L 2224/4918; H05K 2203/049
See application file for complete search history.

(56) References Cited

U.S. PATENT DOCUMENTS 5,929,529 A * 7/1999 Takizawa ............ G03F 7/70625
                                                            257/797
6,720,667 B2   4/2004 Kim
(Continued)

FOREIGN PATENT DOCUMENTS

JP       2009074952       4/2009
JP       5076407          11/2012
(Continued)

*Primary Examiner* — Ida M Soward
(74) *Attorney, Agent, or Firm* — Myers Bigel, P.A.

(57) ABSTRACT

A semiconductor chip includes a substrate including a circuit area having a rectangular shape and a peripheral area surrounding the circuit area, a key area being overlapping a part of the circuit area and a part of the peripheral area, a plurality of drive circuit cells in the circuit area, and a conductive reference line on the peripheral area and extending in a first direction parallel to a first edge among four edges of the rectangular shape of the circuit area.

20 Claims, 14 Drawing Sheets

(51) Int. Cl.
*H01L 29/06* (2006.01)
*H01L 23/00* (2006.01)
*H01L 23/528* (2006.01)
*G02F 1/1345* (2006.01)

(52) U.S. Cl.
CPC ........... *H01L 2224/48095* (2013.01); *H01L 2224/48096* (2013.01); *H01L 2224/48097* (2013.01); *H01L 2224/4918* (2013.01); *H01L 2224/73204* (2013.01); *H01L 2224/81903* (2013.01); *H01L 2224/83851* (2013.01); *H01L 2924/10161* (2013.01); *H01L 2924/14* (2013.01); *H01L 2924/1426* (2013.01); *H01L 2924/15788* (2013.01); *H05K 2203/049* (2013.01)

(56) References Cited

U.S. PATENT DOCUMENTS

| | | | | |
|---|---|---|---|---|
| 7,141,877 B2 * | 11/2006 | Abe | ............... | H01L 24/05 257/737 |
| 7,171,035 B2 * | 1/2007 | Guldi | ............... | H01J 37/3045 257/620 |
| 7,205,637 B2 | 4/2007 | Koike | | |
| 7,781,901 B2 | 8/2010 | Tanemura | | |
| 8,390,031 B2 * | 3/2013 | Han | ............... | H01L 24/06 257/203 |
| 8,809,076 B2 | 8/2014 | Yoshimi | | |
| 9,054,112 B2 * | 6/2015 | Lehr | ............... | H01L 23/544 |
| 9,318,444 B2 * | 4/2016 | Chen | ............... | G03F 7/70625 |
| 9,535,522 B2 * | 1/2017 | Ahn | ............... | G06F 3/041 |
| 9,974,175 B2 * | 5/2018 | Bae | ............... | H01L 24/06 |
| 10,013,091 B2 * | 7/2018 | Katsuta | ............... | G02F 1/13454 |
| 10,025,148 B2 * | 7/2018 | Fujikawa | ............... | G09G 3/006 |
| 10,163,806 B2 * | 12/2018 | Cai | ............... | G02B 27/4255 |
| 10,209,837 B2 * | 2/2019 | Fukushima | ............... | G06F 3/044 |
| 2001/0020988 A1 * | 9/2001 | Ohgiichi | ............... | G02F 1/1345 349/54 |
| 2003/0098469 A1 * | 5/2003 | Spielberger | ............ | B82Y 10/00 257/200 |
| 2006/0017180 A1 * | 1/2006 | Sarma | ............... | H01L 23/544 257/797 |
| 2007/0184634 A1 * | 8/2007 | Suzuki | ............... | H01L 21/78 438/460 |
| 2008/0164469 A1 * | 7/2008 | Kim | ............... | G03F 9/7076 257/48 |
| 2009/0080762 A1 | 3/2009 | Kobayashi | | |
| 2012/0087099 A1 * | 4/2012 | Moon | ............... | H01L 23/13 361/783 |
| 2013/0155366 A1 * | 6/2013 | Morita | ............... | G02F 1/134336 349/143 |
| 2015/0138466 A1 * | 5/2015 | Mori | ............... | G11C 19/287 349/38 |
| 2016/0005697 A1 | 1/2016 | Noh | | |
| 2016/0190522 A1 * | 6/2016 | Lee | ............... | H01L 51/0097 257/40 |
| 2017/0103929 A1 | 4/2017 | Lee | | |
| 2017/0146848 A1 * | 5/2017 | Park | ............... | G02F 1/13306 |
| 2017/0148742 A1 | 5/2017 | Kim | | |
| 2017/0155245 A1 | 6/2017 | Kim | | |
| 2018/0239180 A1 * | 8/2018 | Ogasawara | ............ | G02F 1/1345 |
| 2019/0033646 A1 * | 1/2019 | Shimizu | ............... | G02F 1/13452 |

FOREIGN PATENT DOCUMENTS

| | | |
|---|---|---|
| KR | 1020160004182 | 1/2016 |
| KR | 1020170042206 | 4/2017 |
| KR | 1020170060410 | 6/2017 |

* cited by examiner

US 10,622,312 B2

SEMICONDUCTOR CHIPS AND SEMICONDUCTOR PACKAGES INCLUDING THE SAME

CROSS-REFERENCE TO RELATED APPLICATION

This U.S. non-provisional patent application claims priority under 35 U.S.C. § 119 to Korean Patent Application No. 10-2018-0007893, filed on Jan. 22, 2018, in the Korean Intellectual Property Office, the disclosure of which is incorporated herein in its entirety by reference.

BACKGROUND

The inventive concepts relate to semiconductor chips and semiconductor packages, and, more particularly, to semiconductor chips and semiconductor packages used for driving a display device.

Display devices may include display panels for displaying images and display driver ICs (DDIs) for driving pixels in the display panels. DDIs may convert image signals applied from an external area into drive signals suitable for driving each pixel. At a proper time point, the DDI may apply the converted signals to one or more pixels. DDIs may be included in display devices as a package structure, such as a tape carrier package (TCP), a chip on film (COF) package, and a chip on glass (COG) structure.

SUMMARY

The inventive concepts provide semiconductor chips with increased sorting margins and a decreased percentage of defective devices, without investments for extra photolithography devices.

According to an aspect of the inventive concepts, there is provided a semiconductor chip including: a substrate including a circuit area having a rectangular shape and a peripheral area surrounding the circuit area; key areas overlapping a part of the circuit area and a part of the peripheral area; a plurality of drive circuit cells in the circuit area; and conductive reference lines in the peripheral area and extending in a first direction parallel to a first edge among four edges of the rectangular shape of the circuit area.

According to an aspect of the inventive concepts, there is provided a semiconductor chip including: a substrate including a circuit area and a peripheral area on four sides of the circuit area; a key area overlapping with part of the circuit area and part of the peripheral area, wherein the key area comprises a process pattern; and a conductive reference line extending across the key area in the peripheral area.

According to another aspect of the inventive concepts, there is provided a semiconductor package including: a semiconductor chip including a circuit area having a rectangular shape extending to a first length in a first direction, a plurality of electrode pads arranged adjacent an outer circumference of the circuit area, and conductive reference lines separated from the circuit area having the plurality of electrode pads between and extending to a second length in the first direction; and a support substrate including a chip loading region where the semiconductor chip is loaded thereon and a plurality of wiring patterns electrically connected to the electrode pads.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
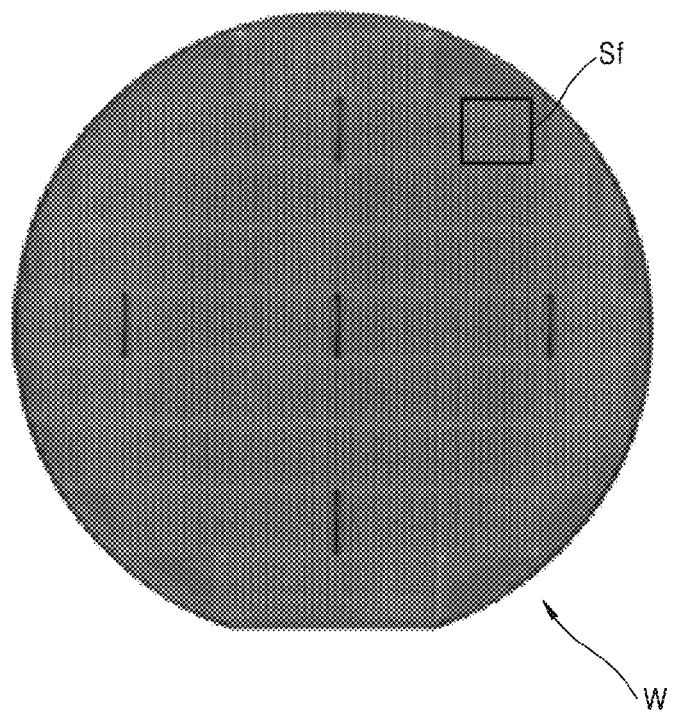
FIG. 1 is a plan view of a wafer including semiconductor chips according to some embodiments of the inventive concepts.

The inventive concepts will now be described more fully with reference to the accompanying drawings, in which example embodiments of the inventive concepts are shown. Like reference numerals in the drawings denote like elements, and thus their description will be omitted.

Figure 2:
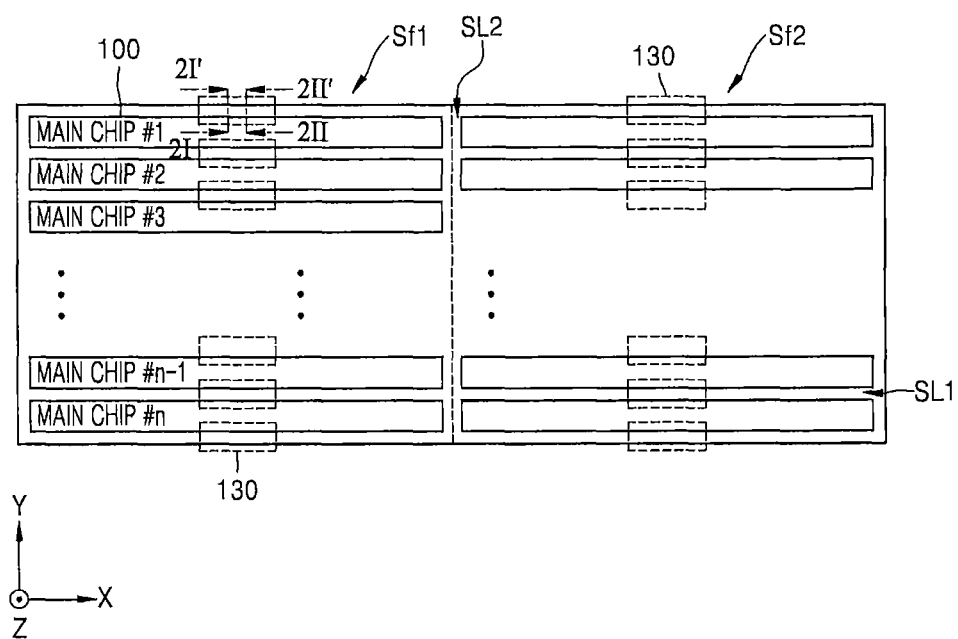
FIG. 2 is a plan view illustrating two full-shots respectively including semiconductor chips according to some embodiments of the inventive concepts.

FIG. 1 is a plan view of a wafer including semiconductor chips according to some embodiments of the inventive concepts. FIG. 2 is a plan view illustrating two full-shots including the semiconductor chips according to some embodiments.

Referring to FIGS. 1 and 2, semiconductor chips 100 according to some embodiments may respectively have a rectangular structure extending in one direction. According to some embodiments, the semiconductor chips 100 may be display driver ICs (DDIs). However, the semiconductor chips 100 are not limited thereto, and may also be memory chips or non-memory chips. An image of the semiconductor chips 100 formed in the wafer W before singulation is illustrated in FIG. 1. According to some embodiments, a plurality of (for example, hundreds of) semiconductor chips 100 may be formed in the wafer W. According to some embodiments, the wafer W may include a plurality of semiconductor chips 100, and first and second scribe lanes SL1 and SL2 that are areas between the semiconductor chips 100. The semiconductor chips 100 may be separately arranged having the first and second scribe lanes SL1 and SL2 between them. The first and second scribe lanes SL1 and SL2 may be used as parting lines to separate the semiconductor chips 100 from one another in a singulation process.

According to some embodiments, on the first and second scribe lanes SL1 and SL2, various kinds of mark patterns, key patterns, process monitoring patterns, which are used in a photolithograph process, and/or patterns for device tests, may be formed. Although the patterns may not affect operations of the semiconductor chips, the patterns may be used to perform semiconductor processes. Hereinafter, unless obviously sorted with other patterns, the patterns will be referred to as "process patterns."

The process patterns, which may be arranged in the first and second scribe lanes SL1 and SL2, may include, for example, a test element group (TEG), an overlay key, a back end of site (BEOS), an oxide site (OS), and an optical CD (OCD). TEG may be a pattern used for testing a process of manufacturing semiconductor devices and characteristics of the manufactured semiconductor devices. The overlay key may be a pattern for measuring alignment states of a layer manufactured in a previous process and a layer manufactured in a current process. BEOS may be a pattern used for measuring a thickness of an uppermost layer after a chemical mechanical polishing (CMP) process. OS may be a pattern used for measuring an outermost layer, like BEOS, and as needed, may be replaced by BEOS. OCD may be a pattern for measuring, for example, a width of a critical line, by using an optical method.

In terms of productivity, widths of scribe lanes are decreasing, accordingly, areas in which process patterns may be formed are becoming narrow. On the other hand, as semiconductor devices are becoming highly integrated, process patterns are being manufactured in various types and a large amount. Accordingly, wider areas are required for scribe lanes. That is, as semiconductor devices become highly integrated, it may be useful to have scribe lanes having greater widths. However, in terms of productivity, widths of the scribe lanes and occupation areas of the scribe lanes in wafers may benefit from being reduced.

In FIG. 1, an area Sf, which is marked in a square of solid lines on the wafer W, may be a part corresponding to a full-shot Sf. The full-shot Sf may also be referred to as a full-field. The full-shot Sf may correspond to an entire mask pattern that may be transcribed by one-time scanning in an exposure process. In general, an exposure process may be performed by reduction scanning projection, for example, reduction scanning projection having a proportion of 4:1. Accordingly, the mask pattern may be downsized to ¼ and may be transcribed on the wafer W.

In FIG. 2, in the wafer W in which the semiconductor chips 100 are provided, parts corresponding to two full-shots Sf1 and Sf2 are shown in an enlarged state. In FIG. 2, two directions, which are respectively parallel to two edges at right angles of the semiconductor chips 100 and cross each other, may be respectively referred to as a first direction (e.g., an X direction) and a second direction (e.g., a Y direction). A direction, which is perpendicular to the first direction (e.g., the X direction) and the second direction (e.g., the Y direction), is referred to as a third direction (e.g., a Z direction). In some embodiments, the first direction may substantially be parallel to longer edges among the edges of the semiconductor chips 100. A direction marked with an arrow in the drawings, and a direction opposite thereto will be described as a same direction. Aforementioned definitions about the direction are also equally used in the drawings.

For example, having the second scribe lanes SL2 extending in the second direction (e.g., the Y direction) as references, a part on the left of the drawing may correspond to a first full-shot Sf1, and a part arranged on the right of the drawing may correspond to a second full-shot Sf2. According to some embodiments, the first scribe lanes SL1 may extend in the first direction (e.g., X direction) and may be aligned in the second direction (e.g., the Y direction). According to some embodiments, the second scribe lanes SL2 may extend in the second direction (e.g., the Y direction) and be aligned in the first direction (e.g., the X direction). The first scribe lanes SL1, among areas between the semiconductor chips 100 in the wafer W, may be areas extending in a direction substantially parallel to an extending direction of the semiconductor chips 100.

The first and second full-shots Sf1 and Sf2 may respectively include a plurality of semiconductor chips 100 aligned in the second direction (e.g., the Y direction). According to some embodiments, each of the first and second full-shots Sf1 and Sf2 may include from dozens to hundreds of semiconductor chips 100. When the semiconductor chips 100 are DDIs, semiconductor chips of from twenty to thirty may be included in each full-shot.

According to some embodiments, key areas 130 may be defined in the wafer W. Here, in the key areas 130, process patterns 131 (see FIG. 3A), which will be described later, may be arranged. According to some embodiments, the key areas 130 may be arranged between the semiconductor chips 100 that are adjacent to one another. According to some embodiments, the key areas 130 may horizontally overlap with the first scribe lanes SL1 and the semiconductor chips 100 adjacent to the first scribe lanes SL1. According to some embodiments, two opposite surfaces of the semiconductor chips 100 in the second direction (e.g., the Y direction) may overlap with the key areas 130. According to some embodiments, the key areas 130 may be arranged approximately in a middle area of the semiconductor chips 100 in the first direction (e.g., the X direction). However, the key areas 130 are not limited thereto, and may be arranged to be adjacent two opposite ends of the semiconductor chips 100 in the first direction (e.g., the X direction).

According to some embodiments, as the key areas 130 are formed on the semiconductor chips and the first scribe lanes SL1, compared to a case in which the key areas 130 are formed only on the first scribe lanes SL1, widths of the first scribe lanes SL1 (e.g., in the Y direction) may be reduced. According to capacity of an apparatus used in processes such as an exposure process, there are lowest limits for sizes of process patterns. As the widths of the first scribe lanes SL1 in the second direction (e.g., the Y direction) decrease, sizes of the semiconductor chips 100 may be increased, or the number of semiconductor chips 100 in the wafer W may be increased.

In some embodiments, from among the process patterns 131a (see FIG. 3A), process patterns 131a having largest sizes may be arranged in the key areas 130. Widths of the first scribe lanes SL1 may be determined by the process patterns 131a having largest sizes among the process patterns 131a (see FIG. 3A) arranged in the first scribe lanes SL1. For example, when a width in the second direction (e.g., the Y direction) of a process pattern, which has a largest size among the process patterns 131a (see FIG. 3A), is about 60 μm, considering a margin width between the circuit area 110 in the semiconductor chips 100 and the first scribe lanes SL1, a width of from about 70 μm to about 80 μm of the first scribe lanes SL1 in the second direction (e.g., the Y direction) may be secured.

In some embodiments, sizes of some of the process patterns 131a (see FIG. 3A) may not be decreased below a certain degree without changing the semiconductor device. However, due to cost concerns, the semiconductor device may not be easily changed. More particularly, an alignment key used for a photolithography process may have a width of approximately 74 μm in the second direction (e.g., the Y direction) and a length of approximately 800 μm in the first direction (e.g., the X direction). In addition, as the alignment key is subject to a photo device, a size of the alignment key may not be reduced without changing the photo device. Accordingly, due to a presence of the alignment key, it is difficult to reduce the width of the first scribe lanes SL1 in the second direction (e.g., the Y direction) to be less than 80 μm.

By forming the key area 130 in the semiconductor chips 100, without extra dispositions such as changing a semiconductor device, widths of the first scribe lanes SL1 in the second direction (e.g., the Y direction) may be easily decreased. Accordingly, sizes of the semiconductor chips 100 according to some embodiments may be increased, or the number of semiconductor chips 100 that may be formed in one wafer W may be increased. Consequently, productivity of the semiconductor chips 100 may be improved.

As needed, additional key areas 130 may be formed on the second scribe lanes SL2. According to some embodiments, by arranging part of the key areas 130 in the second scribe lanes SL2 to overlap with the semiconductor chips 100, it may be possible to promote reduction in the widths of the second scribe lanes SL2 in the first direction (e.g., the X direction). However, as illustrated in FIG. 2, having a full-shot as a reference, although the number of first scribe lanes SL1 may be equal or near to the number of semiconductor chips 100, there may be only two second scribe lanes SL2. The number of second scribe lanes SL2 may be determined by counting each of the second scribe lanes SL2, which are illustrated in an about a half size on two sides of FIG. 2, as one. Accordingly, an effect obtained by arranging the part of the key areas 130 on the second scribe lanes SL2 may be slighter than an effect obtained by arranging the part of the key areas 130 on the first scribe lanes SL1.

Figure 3A:
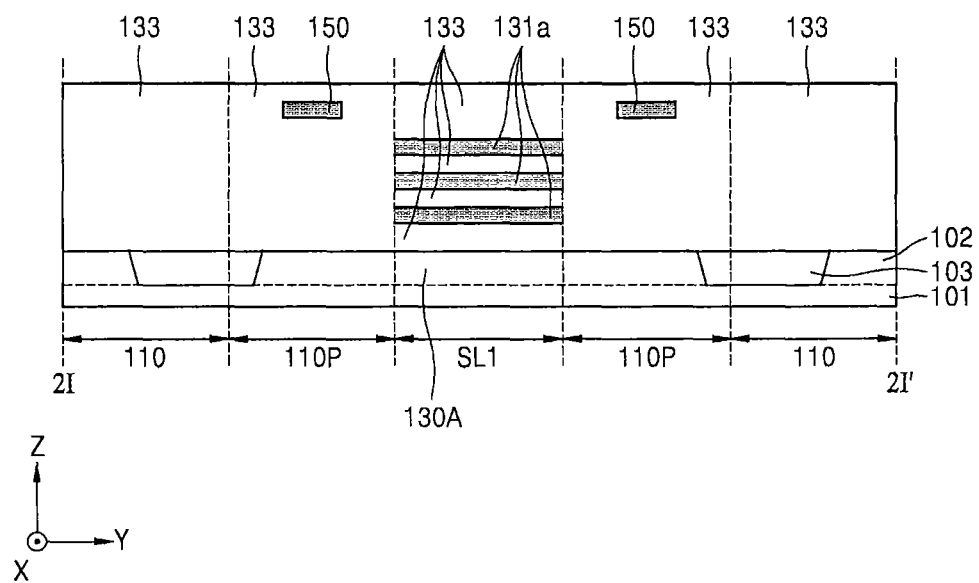
FIGS. 3A and 3B are cross-sectional views taken along lines 2I-2I' and 2II-2II' of FIG. 2.
Figure 3B:
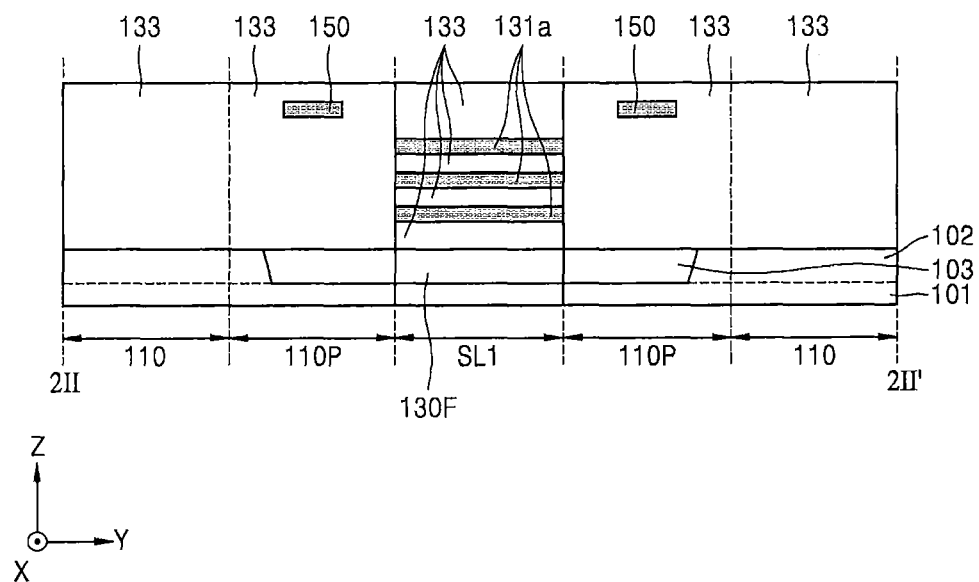

FIGS. 3A and 3B are cross-sectional views respectively and sequentially taken along lines 2I-2I' and 2II-2II' of FIG. 2.

Referring to FIGS. 2 and 3A, each of the semiconductor chips 100 may include a substrate 101, an interlayer dielectric 133 formed on the substrate 101, and conductive process patterns 131a.

Although not illustrated in FIG. 2 due to a size proportion, the semiconductor chips 100 may include conductive reference lines 150 being extended to be substantially parallel to the first direction (e.g., the X direction). Details of a structure and an arrangement of the conductive reference lines 150 will be described later, and location relationships between the conductive reference lines 150 and other components will now be mainly described.

The substrate 101 may be a semiconductor substrate as a silicon wafer or a silicon-on-insulator (SOI) substrate. The substrate 101 may include an active area 102 and field dielectrics 103. The active area 102 may be defined by the field dielectrics 103. The field dielectrics 103 may be within and/or fill trenches formed in the substrate 101. According to some embodiments, the field dielectrics 103 may include oxides, nitrides, or combinations thereof. According to some embodiments, the field dielectrics 103 may include a silicon oxide and/or a silicon nitride. The active area 102 may correspond to an area of the substrate 101 in which the field dielectrics 103 are not formed. Although it is illustrated as the active area 102 and a lower portion of the substrate 101 is distinguished by a broken line, it is for convenience of description, and the active area 102 and the lower portion of the substrate 101 may not actually be physically distinguished.

The substrate 101 before separation may include the first and second scribe lanes SL1 and SL2, a circuit area 110, and a peripheral area 110P. In some embodiments, the first and second scribe lanes SL1 and SL2, the circuit area 110, and the peripheral area 110P are not distinguished by a physical boundary. In the circuit area 110, a plurality of drive circuit cells 111 (see FIG. 4), which will be described later, may be arranged. The peripheral area 110P may surround the circuit area 110. The active area 102 described above is a term distinguished from the first and second scribe lanes SL1 and SL2, the circuit area 110, and the peripheral area 110P, and may or may not vertically overlap with the first and second scribe lanes SL1 and SL2, the circuit area 110, and/or the peripheral area 110P.

According to some embodiments, the interlayer dielectrics 133, the process patterns 131a, and/or the conductive reference lines 150 may be formed above the substrate 101. The interlayer dielectrics 133 may include, for example, oxides, nitrides, or combinations thereof. The interlayer dielectrics 133 may include, for example, a silicon oxide. The interlayer dielectrics 133 may be on (e.g., cover) the substrate, the process patterns 131a, and/or the conductive reference lines 150, thereby preventing and/or reducing an unexpected electrical shunt therebetween. Referring to FIG. 3A, it is illustrated as vias are not formed between the process patterns 131a, but the embodiments are not limited thereto, and, in some embodiments, vias may be added. The process patterns 131a may include conductive materials. The process patterns 131a may include, for example, at least one material from among a group including Cu, Al, Ni, Ag, Au, Pt, Sn, Pb, Ti, Cr, Pd, In, Zn, C, graphene, and/or alloys thereof.

Referring to FIGS. 2 and 3A, the process patterns 131a may be arranged above a key active area 130A that is an area horizontally covered by the field dielectrics 103 and has a wide horizontal area. In other words, the key area 130 may be defined by a horizontal location of the key active area 130A. The name and the reference number of the key active area 130A are used to distinguish the key active area 130A from other active areas 102. According to some embodiments, portions of the key active area 130A may vertically overlap with the conductive reference lines 150.

However, the process patterns 131a are not limited thereto. Referring to FIG. 3B, the process patterns 131a may be arranged above a key field dielectric 130F that is an area horizontally covered by the active area 102 and having a wide horizontal area. In other words, the key area 130 may be defined by a horizontal location of the key field dielectric 130F. The name and reference numeral of the key field dielectric 130F are used to distinguish the key field dielectric 130F from other field dielectrics 103. According to some embodiments, portions of the key field dielectric 130F may vertically overlap with the conductive reference lines 150.

Referring to FIGS. 3A and 3B, the key area 130 may be arranged on the first scribe lane SL1 and the peripheral areas 110P adjacent to the first scribe lane SL1. Also, the key area 130 may be a wide area of the active area 102 surrounded by the field dielectrics 103, or a wide area of the field dielectrics 103 surrounded by the active area 102. Due to differences in the optical characteristics between the active area 102 and the field dielectrics 103, when widths of the field dielectrics 103 surrounded by the active area 102 or the active area 102 surrounded by the field dielectric 103 is greater than a certain width, it is may be possible to optically identify positions of the active area 102 or the field dielectrics 103.

Although the process patterns 131a are illustrated as being arranged only on the first scribe lanes SL1, the process patterns 131a are not limited thereto. For example, the process patterns 131a may be extended on the first scribe lanes SL1 and to the peripheral area 110P. The process patterns 131a may be formed, above the key area 130, in the form of a plurality of layers separated by the interlayer dielectrics 133. The process patterns 131a may not include a conductive pattern on a top layer conductive pattern. Among conductive patterns being arranged above the circuit area 110, the peripheral area 110P, the first scribe lanes SL1 and in the interlayer dielectrics 133, the top layer conductive pattern may refer to a conductive pattern farthest from an upper surface of the substrate.

The conductive reference lines 150 may extend in the first direction (e.g., the X direction) in the peripheral area 110P. The conductive reference lines 150 may include conductive materials. The conductive reference lines 150 may include, for example, at least one material from among a group including Cu, Al, Ni, Ag, Au, Pt, Sn, Pb, Ti, Cr, Pd, In, Zn, C, graphene, and/or alloys thereof. The conductive reference lines 150 may be the top layer conductive pattern. The conductive reference lines 150 may be separated farther than the process patterns 131a from the upper surface of the substrate 101. The conductive reference lines 150 may be arranged at a vertical level higher than the process patterns 131a.

Figure 4:
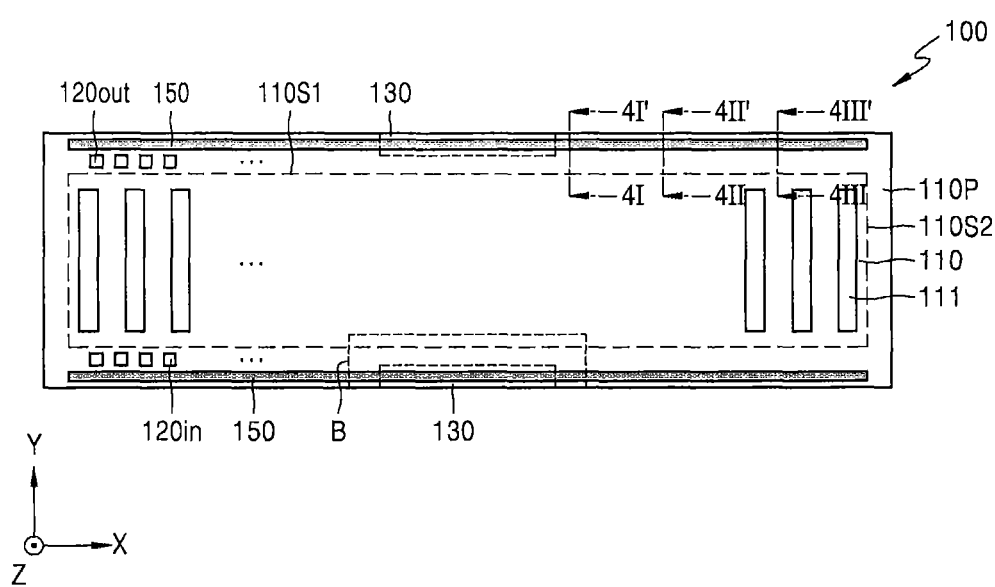
FIG. 4 is a plan view of a semiconductor chip according to some embodiments of the inventive concepts.
Figure 5A:
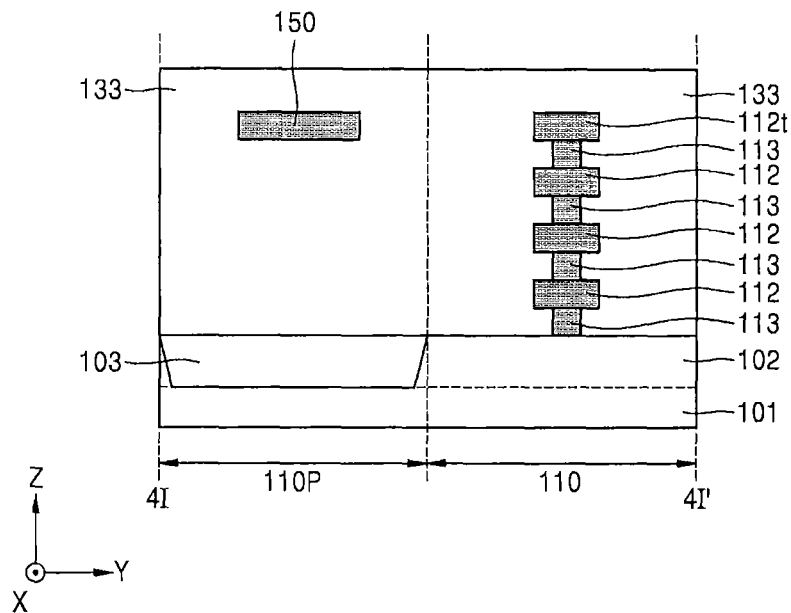
FIGS. 5A through 5C are cross-sectional views taken along lines 4I-4I', 4II-4II', and 4III-4III' of FIG. 4.
Figure 5B:
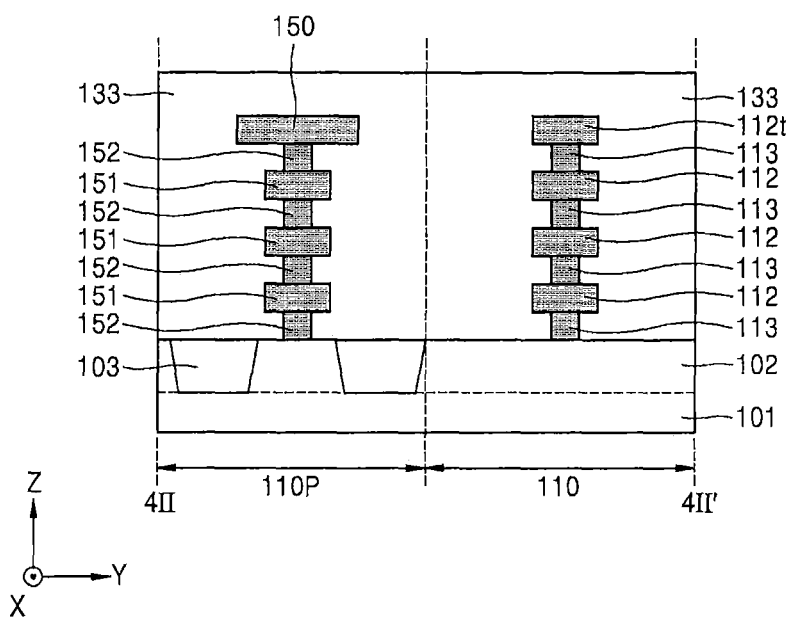
Figure 5C:
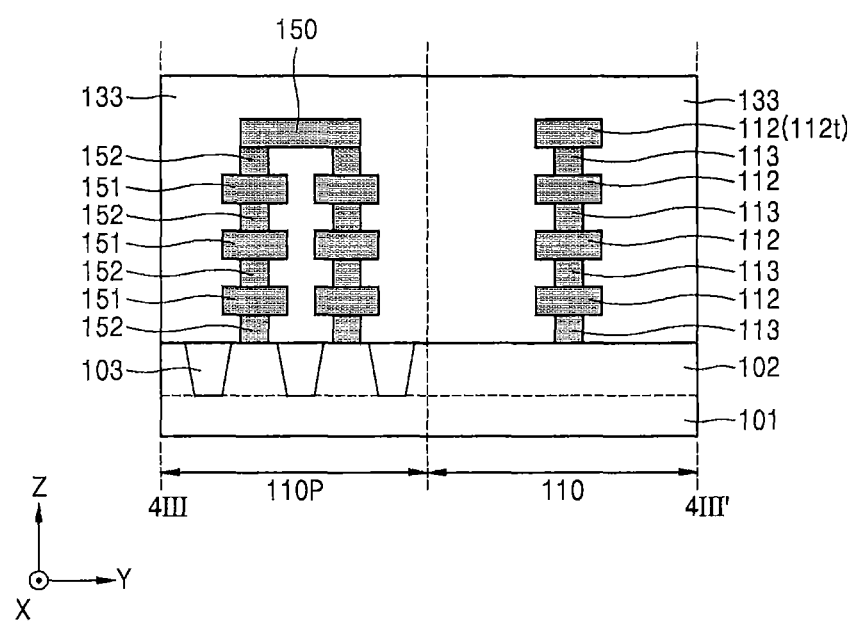

FIG. 4 is a plan view for describing the semiconductor chip 100 according to some embodiments of the inventive concepts. FIGS. 5A through 5C are partial cross-sectional views respectively taken along lines 4I-4I', 4II-4II', and 4III-4III' of FIG. 4.

Referring to FIGS. 4 and 5A through 5C, the semiconductor chip 100 according to some embodiments may include a circuit area 110, a peripheral area 110P, input and output electrode pads 120in and 120out, and a key area 130. The semiconductor chip 100 shown in FIG. 4 may be any one of the singulated semiconductor chips from among the semiconductor chips 100 illustrated in FIG. 2. Accordingly, the key area 130 included in the semiconductor chip 100 may be an area that is left after the key areas 130 included in the first scribe lanes SL1 of FIG. 2 are eliminated. According to some embodiments, the semiconductor chip 100 may be a DDI.

According to some embodiments, the circuit area 110, in terms of a top view, may approximately be a rectangle. According to some embodiments, the circuit area 110 may approximately be a rectangle extending in the first direction (e.g., the X direction). According to some embodiments, the circuit area 110 may include first edges 110S1 and second edges 110S2. The first edges 110S1 may be edges extending in the first direction (e.g., the X direction). The second edges 110S2 may be edges extending in the second direction (e.g., the Y direction). Lengths of the first edges 110S1 may be longer than lengths of the second edges 110S2.

According to some embodiments, a plurality of drive circuit cells 111 may be arranged in the circuit area 110. According to some embodiments, the circuit area 110 may include a plurality of conductive patterns 112 and a plurality of conductive vias 113. Among the conductive patterns 112, a pattern farthest from an upper surface of the substrate 101 is referred to as a top layer conductive pattern 112t. For example, when four layers of the conductive patterns 120 are provided, a fourth conductive pattern 112 from the bottom may be the top layer conductive pattern 112t. Through the conductive patterns 112 and the conductive vias 113, the drive circuit cells 111 may be electrically connected to the input and output electrode pads 120in and 120out. When the semiconductor chip 100 is placed on a printed circuit board and connected to display panels, the drive circuit cells 111, in response to drive control signals and a power signal that are applied by the printed circuit board through the input electrode pads 120in, may generate data signals to drive the display panel and output the data signals through the output electrode pads 120out. For example, the drive circuit cells 111 may be formed as many as the number of output electrode pads 120out.

According to some embodiments, each of the drive circuit cells 111 may include, for example, a shift register, a data register, a line latch unit, a digital-analog converter, and/or an output buffer unit. The shift register may generate sequential latch pulses and provide the generated latch pulses to the line latch unit. That is, the shift register may provide the latch pulses, which are made by shifting horizontal opening signals input by a timing controller of the printed circuit board, to the line latch unit.

The data register may apply digital data signals, for example, red, green, and blue digital data signals, which may be sequentially input, to the line latch unit. The line latch unit may latch the digital data signals in line units, and may, when a load signal is input thereto, output data signals in units of latched lines. A digital-analog converter may, based on a grayscale voltage, convert the digital data signals, which are provided by the line latch unit, into a data voltage, which is an analog data signal corresponding to the digital data signals, and output the converted digital data signals. An output buffer unit may adjust the analog-converted signal to be close to a reference level and output the data signal that is analog-converted and adjusted.

A level shifter and an amplifier may be included in the digital-analog converter and the output buffer unit, and the power signal from the printed circuit board may be applied to the level shifter and the amplifier.

The peripheral area 110P, which is an area horizontally on and, in some embodiments, covering the circuit area 110, may be arranged around outskirts (e.g., a circumference) of the circuit area 110. In the peripheral area 110P, the input and output electrode pads 120in and 120out may be arranged. According to some embodiments, the input and output electrode pads 120in and 120out may be arranged at a substantially same level as the top layer conductive patterns 112t. The input electrode pads 120in may respectively form input units together with external connection terminals such as bumps, and the output electrode pads 120out may form output units together with external connection terminals such as bumps. According to some embodiments, the input and output electrode pads 120in and 120out may be aligned along the first edges 110S1 of the semiconductor chip 100. The input and output electrode pads 120in and 120out may be spaced apart from the first edges 110S1 and arranged in the first direction (e.g., the X direction).

The input electrode pads 120in may include a plurality of signal input pads, which receive inputs of drive control signals from the printed circuit board, and at least one power input pad receiving an input of a power signal from the printed circuit board. According to some embodiments, the output electrode pads 120out may, as described above, be electrically connected to the drive circuit cells 111. Data signals generated in the drive circuit cells 111 may be externally output through the output electrode pads 120out.

According to some embodiments, before performing the singulation process of the semiconductor chips 100, external connection terminals such as bumps may be connected to each of the input and output electrode pads 120in and 120out. According to some embodiments, the semiconductor chip 100 may further include the external connection terminals arranged on the input and output electrode pads 120in and 120out. According to some embodiments, the external connection terminals may be formed as, for example, metal bumps. According to some embodiments, the key area 130 may be arranged in the peripheral area 110P.

According to some embodiments, the conductive reference lines 150 may extend in the first direction (e.g., the X direction). According to some embodiments, the conductive reference lines 150 may extend across the key area 130. According to some embodiments, lengths of the conductive reference lines 150 in the first direction (e.g., the X direction) may substantially be equal to the lengths of the first edges 110S1. According to some embodiments, the lengths of the conductive reference lines 150 in the first direction (e.g., the X direction) may be longer than the lengths of the second edges 110S2. According to some embodiments, widths in the second direction (e.g., the Y direction) of the conductive reference lines 150 may substantially be the same. According to some embodiments, widths in the second direction (e.g., the Y direction) of the conductive reference lines 150 may be uniform in reference distances 150W (see FIG. 6A). According to some embodiments, widths of the conductive reference lines 150 in the second direction (e.g., the Y direction) may be less than the width of the key area 130 in the second direction (e.g., the Y direction). According to some embodiments, the conductive reference lines 150 may be arranged to be adjacent to outer edges of the peripheral area 110P. According to some embodiments, the conductive reference lines 150 may be arranged to be closer to the outer edges of the peripheral area 110P than to a first edge 110S1 of the circuit area 110.

According to some embodiments, the conductive reference lines 150 may be arranged at a vertical level that is equal to or higher than the level of the conductive patterns 112. According to some embodiments, the conductive reference lines 150 may be separated from an upper surface of the substrate 101 farther than the conductive patterns 112 except for the top layer conductive pattern 112t. According to some embodiments, the conductive reference lines 150 may be arranged at a vertical level that is substantially equal to a level of the top layer conductive pattern 112t.

Here, referring to FIG. 5A, the interlayer dielectrics 133 may be provided under a part of the conductive reference lines 150. According to some embodiments, part of the conductive reference lines 150 may be entirely covered by the interlayer dielectrics 133. According to some embodiments, as the conductive reference lines 150 are arranged to be adjacent to the first edges 110S1, defects such as cracks or chipping may be prevented from being spread to the circuit area 110. According to some embodiments, the conductive reference lines 150 may be waterproofing layers for the circuit area 110. Accordingly, as defect occurrence of the semiconductor chip 100 decreases, reliability of the semiconductor chip 100 may be improved.

Referring to FIG. 5B, under another part of the conductive reference lines 150, conductive protection patterns 151 and conductive protection vias 152 may be formed. According to some embodiments, a part of the conductive reference lines 150, through the conductive protection patterns 151 and the conductive protection vias 152, may be connected to an active area 102 of the substrate 101. However, parts of the conductive reference lines 150 are not limited thereto, and may, through the conductive protection patterns 151 and the conductive protection vias 152, be connected to the field dielectrics 103. In some embodiments, a part of the conductive protection patterns 151 and the conductive protection vias 152, which are illustrated in FIG. 5B, may be omitted. Referring to FIG. 5B, in addition to the conductive reference lines 150 in a part corresponding to FIG. 5A, the conductive protection patterns 151 and the conductive protection vias 152 may be arranged under the conductive reference lines 150. According to some embodiments, the conductive reference lines 150, the conductive protection patterns 151, and the conductive protection vias 152 may reduce and/or prevent defects, such as cracks or chipping, from being spread to the circuit area 110. According to some embodiments, the conductive reference lines 150, the conductive protection patterns 151, and the conductive protection vias 152 may be waterproofing membranes for the circuit area 110. Accordingly, defect occurrence of the semiconductor chips 100 may decrease, and reliability of the semiconductor chips 100 may be improved.

Referring to FIG. 5C, under another part of the conductive reference lines 150, the conductive protection patterns 151 and the conductive protection vias 152 may be formed. According to some embodiments, under the conductive reference lines 150, the conductive protection patterns 151 having a bilayer structure and the conductive protection vias 152 may be arranged. In some embodiments, the bilayer structure may indicate that the conductive protection patterns 151 and the conductive protection vias 152 horizontally overlap. In some embodiments, the bilayer structure may indicate that a first one of the conductive protection patterns 151 is at a same horizontal layer as a second one of the conductive protection patterns 151. In some embodiments, the bilayer structure may indicate that a first one of the conductive protection vias 152 is at a same horizontal layer as a second one of the conductive protection vias 152. A portion of the semiconductor chip 100 illustrated in FIG. 5C, unlike FIG. 5B, includes conductive protection patterns 151 and conductive protection vias 152, which have bilayer structures, may more effectively reduce and/or prevent defects such as cracks or chipping from being spread to the circuit area 110. According to some embodiments, the conductive reference lines 150, the conductive protection patterns 151, and the conductive protection vias 152 may be waterproofing layers for the circuit area 110. Accordingly, defect occurrence of the semiconductor chip 100 may decrease, and reliability of the semiconductor chip 100 may be improved.

According to some embodiments, FIGS. 5A through 5C may respectively be parts horizontally spaced (e.g., in the first direction) apart from the key area 130. Structures of FIGS. 5A through 5C may respectively correspond to other parts of the conductive reference lines 150. Vertical cross-sectional structure according to FIGS. 5A through 5C may be arranged in arbitrary orders and combinations as needed. According to some embodiments, the structures according to FIGS. 5A through 5C may, at certain intervals, be sequentially and alternatively arranged. According to some embodiments, two among the structures according to FIGS. 5A through 5C may be respectively arranged at certain intervals.

According to some embodiments, like in FIG. 5A, in an area between the substrate 101 and all of the conductive reference lines 150, which is an area horizontally spaced apart from the key area 130, only the interlayer dielectrics 133 and the field dielectrics 103 may be arranged. According to some embodiments, like in FIG. 5B, in the area between the substrate 101 and all of the conductive reference lines 150, which is the area horizontally spaced apart from the key area 130, the conductive protection patterns 151 and the conductive protection vias 152 may be arranged. According to some embodiments, like in FIG. 5C, in the area between the substrate 101 and all of the conductive reference lines 150, which is the area horizontally spaced apart from the key area 130, the conductive protection patterns 151 and the conductive protection vias 152 may be arranged in a bilayer structure.

FIGS. 6A through 6D are partial plan views showing enlarged region B of FIG. 4.

Figure 6A:
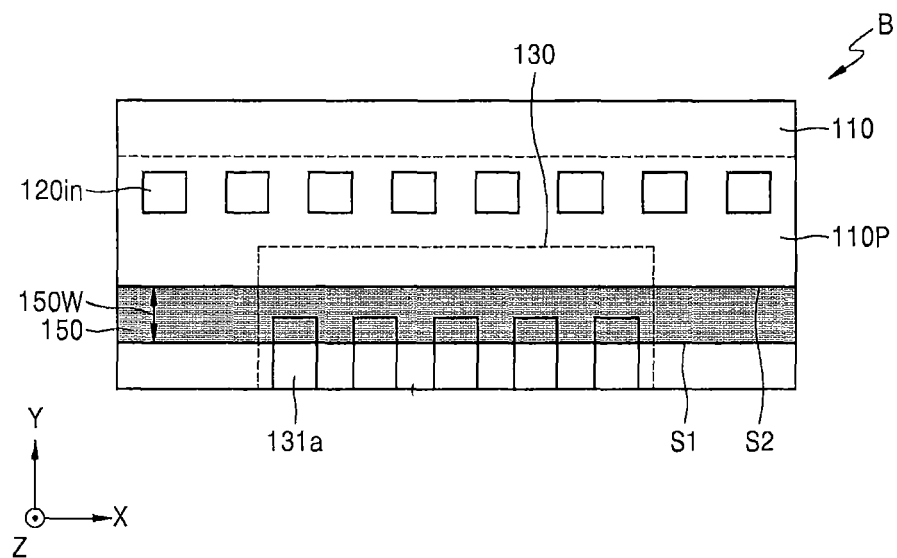
FIGS. 6A through 6D are partial plan views of semiconductor chips according to some embodiments of the inventive concepts.

Referring to FIG. 6A, the process patterns 131a may be vertically on a part of the conductive reference lines 150. In some embodiments, a length of the key area 130 in the second direction (e.g., the Y direction) may be equal to or greater than lengths of the process patterns 131a in the second direction. The key area 130 may be determined by a horizontal location of the key active area 130A (see FIG. 3A), which is arranged below the key area 130, and/or the key field dielectric 130F (see FIG. 3B).

According to some embodiments, the process patterns 131a arranged in the key area 130 may be alignment keys used in the photolithography process. The process patterns 131a in the key area 130 may, in the first direction (e.g., the X direction), be separated and arranged at certain intervals. The process patterns 131a, according to some embodiments, are not limited to the alignment keys used in the photolithography process. For example, other arbitrary process patterns, which may limit reduction in the widths of the first scribe lanes SL1 by using larger sizes, may also be formed in the key area 130.

According to some embodiments, to secure process margins, the conductive reference lines 150 may be spaced apart from the edge of the peripheral area 110P. According to some embodiments, the conductive reference line 150 may include a first reference edge S1 and a second reference edge S2 parallel to the first direction (e.g., the X direction). According to some embodiments, a distance between the first reference edge S1 and the second reference edge S2 may be a reference distance 150W. In some embodiments, the reference distance 150W may be constant. According to some embodiments, the reference distance 150W may be equal to or greater than a shortest distance that may be identified by a measurement apparatus. The measurement apparatus may be used for sorting defective devices and normal devices, by identifying whether the devices are defective or not. The reference distance 150W, for example, may be in a range of from approximately 0.1 μm to approximately 10 μm, but is not limited thereto.

Figure 6B:
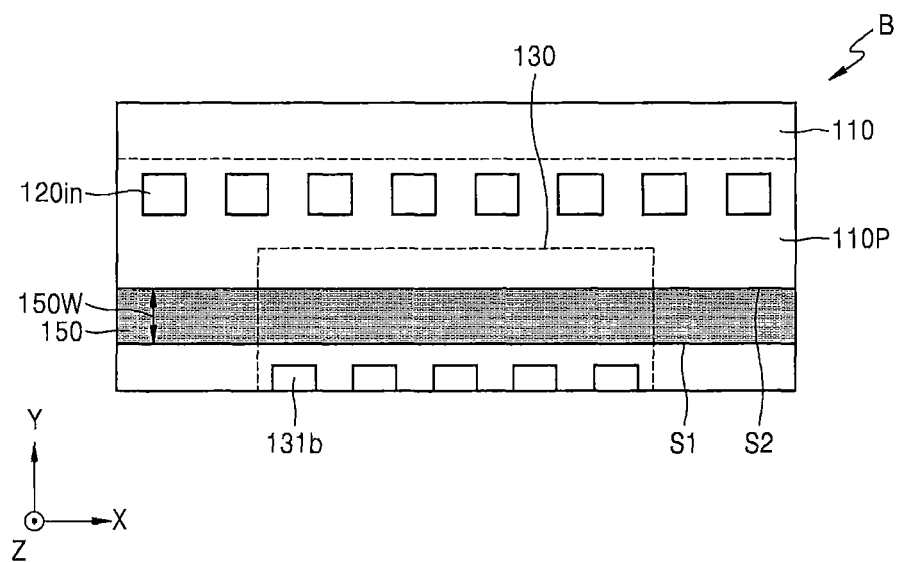

Referring to FIG. 6B, unlike in FIG. 6A, although process patterns 131b are arranged on the peripheral area 110P, the process patterns 131b may not vertically overlap with the conductive reference lines 150. According to some embodiments, although the process patterns 131b may be extended inward from an outer edge of the peripheral area 110P, as lengths of the process patterns 131b in the second direction (e.g., the Y direction) are relatively short, the process patterns 131b may be horizontally spaced apart from the conductive reference lines 150.

Figure 6C:
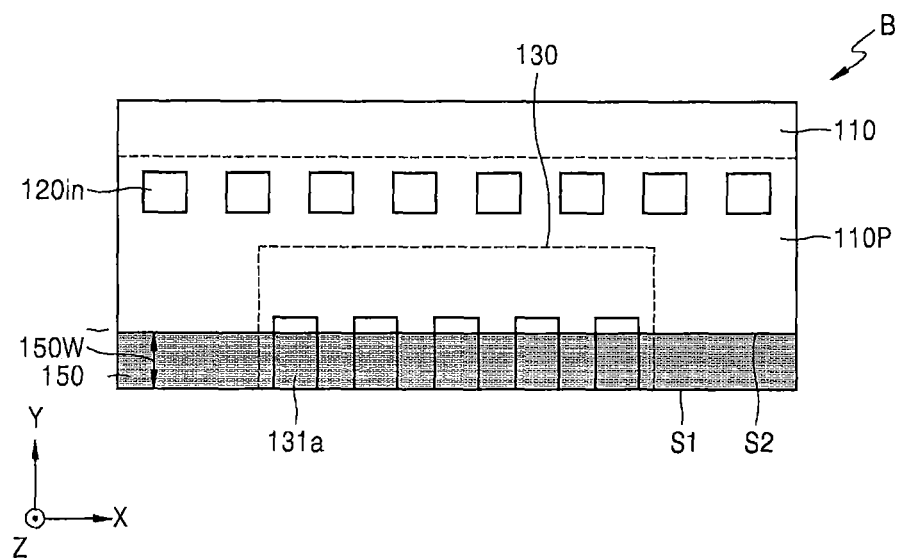

Referring to FIG. 6C, unlike in FIG. 6A, a first reference edge S1 of the conductive reference lines 150 may be arranged to correspond to an edge of the peripheral area 110P. In some embodiments, the input electrode pads 120in and the conductive reference lines 150, to secure process margins, may be separated at more than certain intervals. According to some embodiments, as the conductive reference lines 150 are moved relatively close to the edge of the peripheral area 110P, the input electrode pads 120in may also move toward the edge of the peripheral area 110P. Accordingly, as a width of an area, which may be used as the circuit area 110, may increase, sizes of the semiconductor chips 100 may be increased, or the number of semiconductor chips in the wafer W of FIG. 1 may be increased.

Figure 6D:
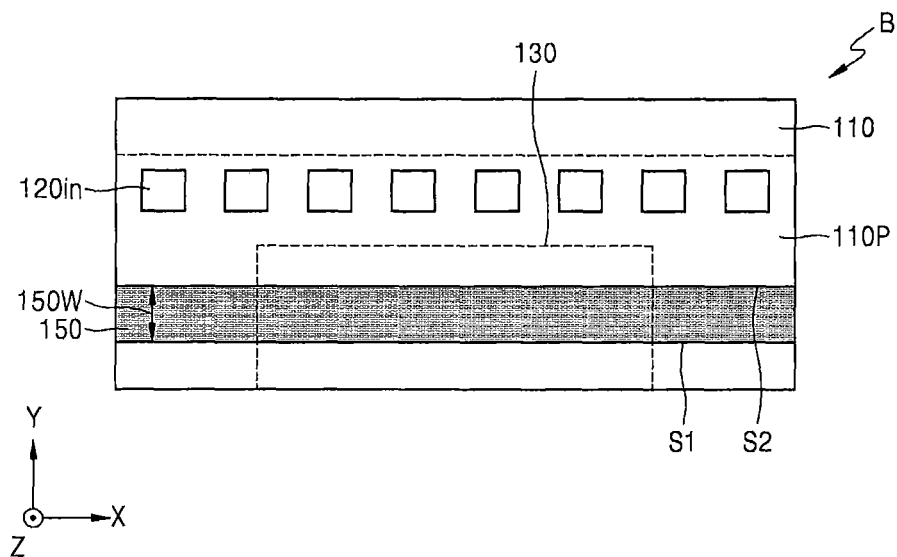

Referring to FIG. 6D, unlike in embodiments described in FIGS. 6A and 6B, the process patterns 131b may not be arranged in the peripheral area 110P. According to some embodiments, before singulation, the process patterns (not shown) may only be arranged on the first and second scribe lanes SL1 and SL2 (see FIG. 2) and be totally eliminated in a dicing process for singulation.

Figure 7A:
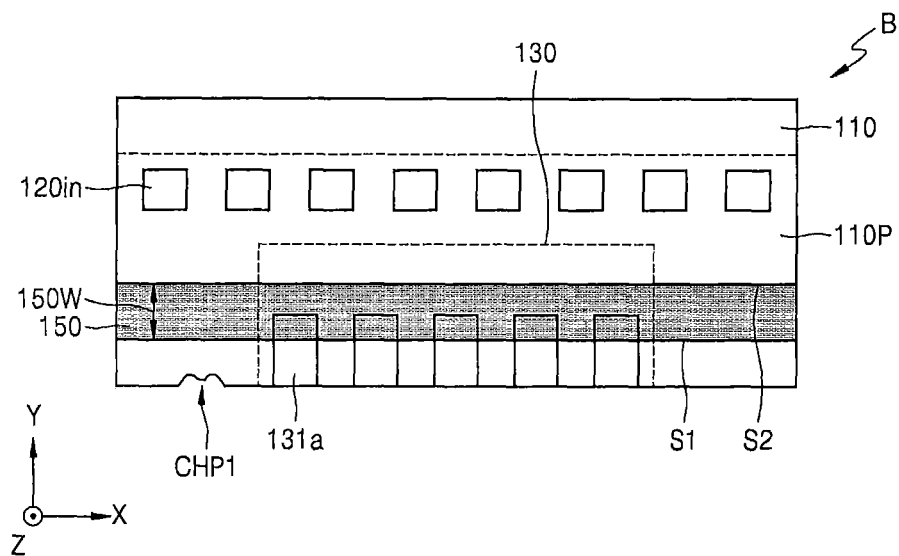
FIGS. 7A through 7C are partial plan views illustrating effects of a semiconductor chip according to some embodiments of the inventive concepts.
Figure 7B:
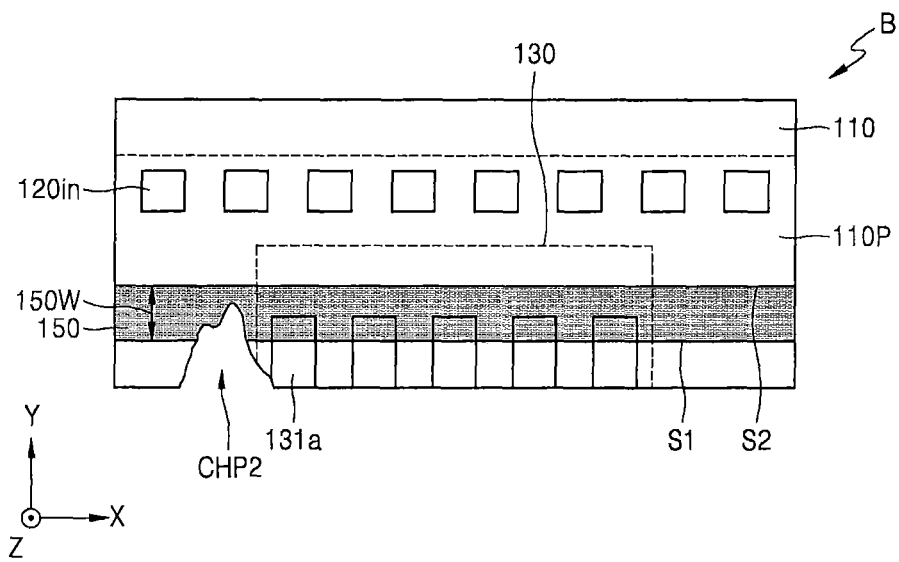
Figure 7C:
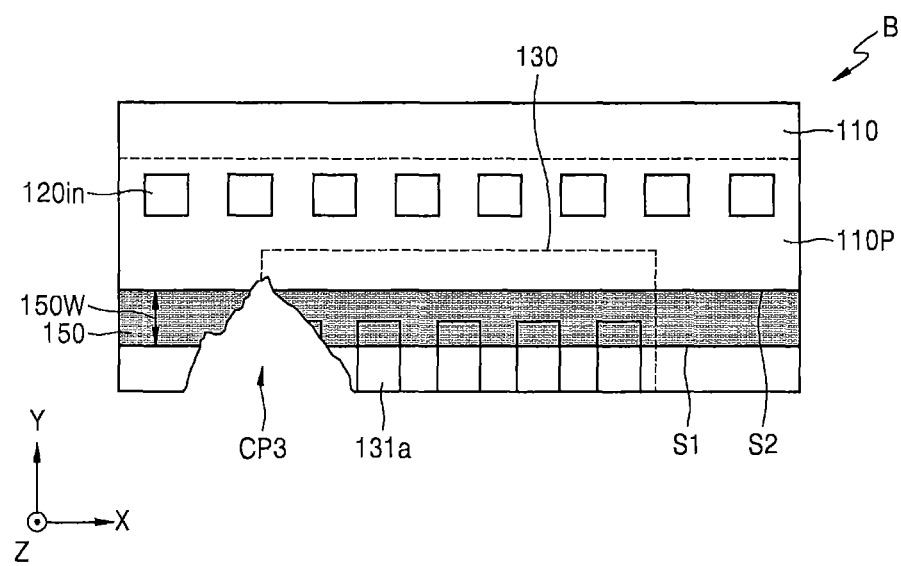

FIGS. 7A through 7C are enlarged partial plan views of region B of FIG. 4 for describing effects of the semiconductor chip 100 according to some embodiments of the inventive concepts. Referring to FIG. 7A through 7C, while a singulation process of the semiconductor chips 100 is performed, different chippings CHP1, CHP2, and CHP3 occur.

In detail, FIG. 7A shows a case in which a chipping CHP1 is caused in the peripheral area 110P out of the conductive reference line 150. The chipping CHP1 of FIG. 7A may be formed in a range not approaching the first reference edge S1.

FIG. 7B is a case in which, although a chipping CHP2 approaches the conductive reference line 150, the chipping CHP2 is not spread to an inner area of the conductive reference line 150. The chipping CHP2 of FIG. 7B, which reaches the first reference edge S1, may not reach the second reference edge S2.

FIG. 7C shows a case in which a chipping CP3 extends into the inner area of the conductive reference line 150. The chipping CHP3 of FIG. 7C may cross the second reference edge S2 and be extended to the peripheral area 110P beyond the second reference edge S2.

As described above, the reference distance 150W, which is the distance between the first and second reference edges S1 and S2, may be equal to or greater than the shortest distance that may be identified by the measurement apparatus. As semiconductor chips in the related art do not have reference lines, chippings are identified having edges of a peripheral area with a reference, and the identified chippings are counted as defects. On the other hand, in the semiconductor chip 100 according to some embodiments, the conductive reference lines 150, having a distance that may be identified by a measurement apparatus, may be provided. Accordingly, first and second reference edges S1 and S2 of the conductive reference lines 150 may respectively be references in determining errors. In detail, as the cases in which the chippings CHP1 and CHP2 are formed outside the second reference edge S2 of the conductive reference lines 150 are not classified as defects, accuracy with respect to sorting out defects may be improved.

Referring again to FIG. 2, to reduce sizes of the first scribe lanes SL1, a structure in which the key areas 130, where alignment keys are formed, are arranged on semiconductor chips 100 adjacent one another and the scribe lanes therebetween is adopted. However, in the aforementioned structure, near the key area 130, due to chipping, many defects may be caused. Furthermore, measurement apparatuses, which are currently being used, may not identify a boundary surface for identifying chipping defects near the key area 130.

In the semiconductor chip 100 according to some embodiments, the conductive reference lines 150, which may be also be applied to the key areas 130, is provided, and thus, reliability of monitoring with respect to a singulation process may be improved.

Figure 8:
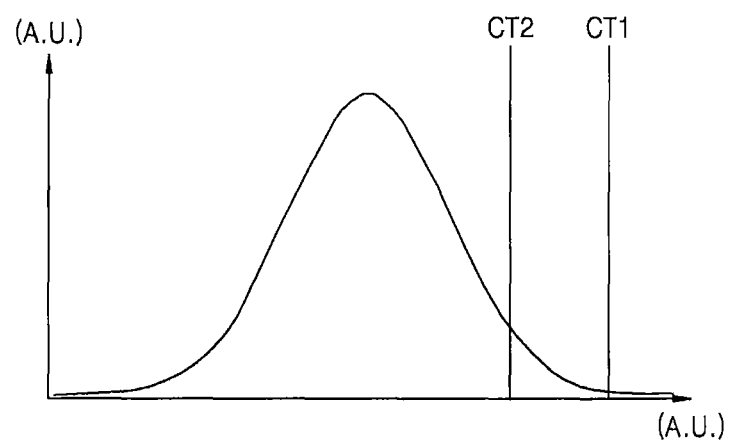
FIG. 8 is a graph illustrating the effects of semiconductor chips according to some embodiments of the inventive concepts.

Here, FIG. 8 is a graph for describing effects of the inventive concepts, according to some embodiments. In a graph of FIG. 8, the horizontal axis indicates sizes of occurred chipping, and the vertical axis indicates frequency of occurrence. The horizontal axis and the vertical axis of FIG. 8 are respectively shown in arbitrary units (A.U.). According to an experimental embodiment, sizes of the chippings, as shown in FIG. 8, approximately follow normal distribution. As the semiconductor chip according to some embodiments provides conductive reference lines, defect occurrence due to chippings may be identified more accurately than in the related art.

In detail, CT1 of FIG. 8 indicates a reference value of defect identification according to sizes of chippings in some embodiments, and CT2 indicates a reference value of defect identification according to sizes of chippings in the related art. In the related art, a semiconductor chip with chippings having sizes equal to or greater than CT2 is considered to be defective, and in embodiments of the inventive concepts, semiconductor chips with chippings having sizes equal to or greater than CT1 are considered to be defective. Accordingly, in the related art, although chippings having sizes of from between CT2 to CT1 are considered to be defects, in the embodiments of the inventive concepts, the chippings may be considered to be not defective. Accordingly, sorting margins with respect to defects may be increased. According to some embodiments, when chippings occur at a same degree without changing an apparatus, the number of normal semiconductor chips that are considered to be not defective may increase. Accordingly, production efficiency of the semiconductor chip may be improved.

Figure 9A:
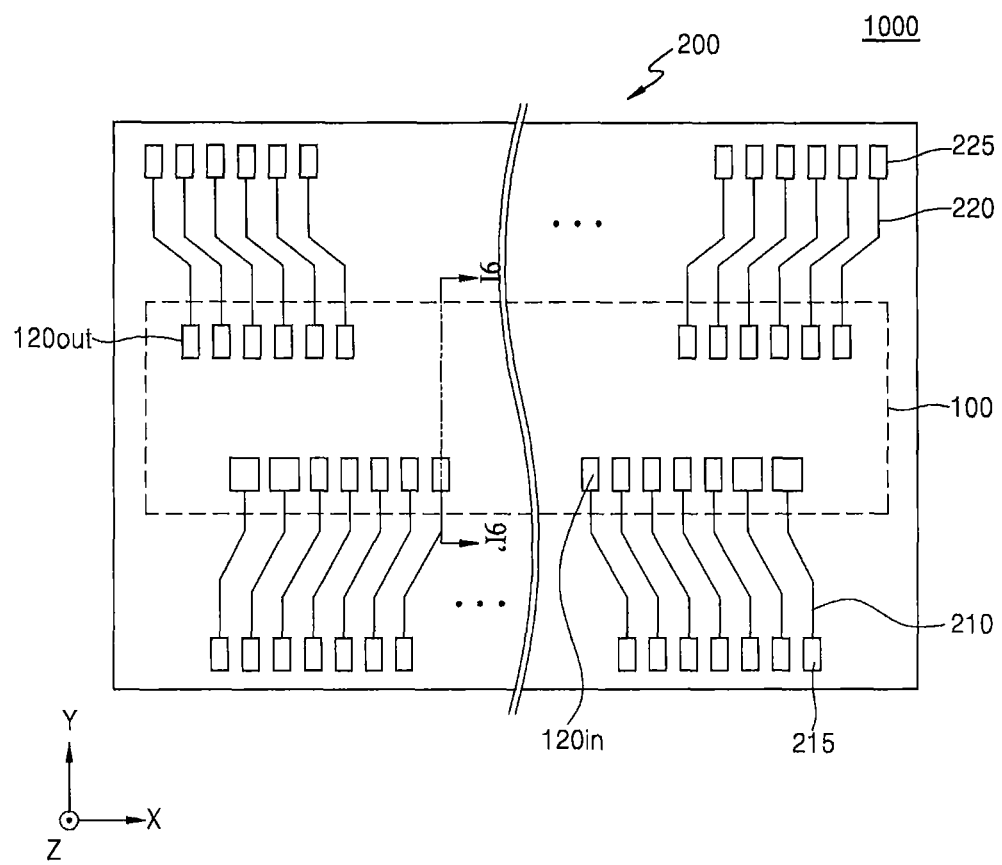
FIGS. 9A and 9B are respectively a plan view and a cross-sectional view for describing a semiconductor package including a semiconductor chip according to an embodiment of the inventive concepts.
Figure 9B:
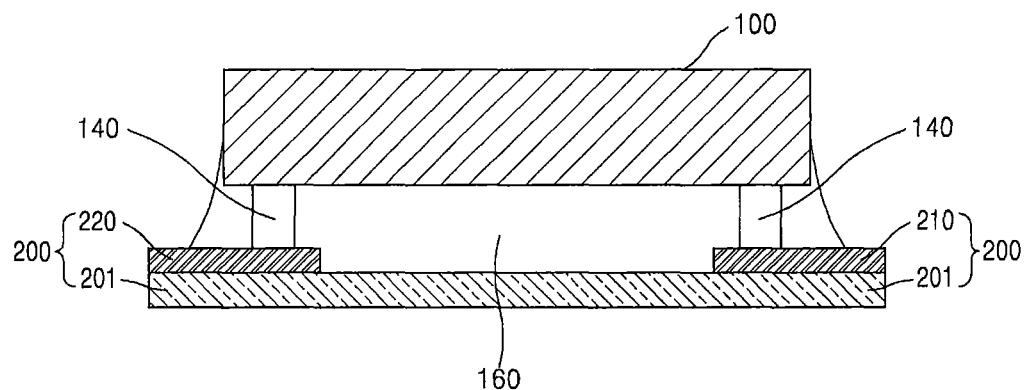

FIGS. 9A and 9B are respectively a top plan-view and a cross-sectional view of a semiconductor package 1000 including the semiconductor chip 100 according to some embodiments of the inventive concepts, and FIG. 9B is a cross-sectional view taken along line 9I-9I' of FIG. 9A. For convenience of description, descriptions overlapping with those of FIGS. 1 through 8 are omitted, and differences are mainly described.

Referring to FIGS. 9A and 9B, the semiconductor package 1000 of the embodiment may include the semiconductor chip 100 and a tape wiring board 200.

The semiconductor chip 100 may be a source driver IC that generates an image signal by receiving inputs of signal voltage from a printed circuit board and outputs the image signal to a data line of a display panel. The semiconductor chip 100 may also be a gate driver IC that generates a scanning signal including on/off signals of a transistor and outputs the scanning signal to a gate line of a display panel.

According to some embodiments, the semiconductor chip 100 may, by using a flip-chip bonding method, be loaded above a chip loading region of the base film 201. According to some embodiments, on the input and output electrode pads 120in and 120out of the semiconductor chip 100, external connection terminals 140 such as bumps may be arranged. As the external connection terminals 140 are electrically combined with wiring patterns 210 and 220 of the tape wiring board 200, the semiconductor chip 100 may be loaded above the tape wiring board 200. In order to protect a combination area between the external connection terminals 140 and the wiring patterns 210 and 220 from physical and/or chemical damages, underfill 160 may be provided between the semiconductor chip 100 and the tape wiring board 200. In some embodiments, the semiconductor chip 100 may be the semiconductor chip 100 including the conductive reference lines 150 shown in FIG. 4.

Although it is illustrated in FIG. 9A that part of the input and output electrode pads 120in and 120out and part of the wiring patterns 210 and 220 are arranged above the semiconductor chip 100, it is merely for convenience of description. In a flip-chip loading method of the embodiments, as the input and output electrode pads 120in and 120out are arranged under the semiconductor chip 100 and parts of the wiring patterns 210 and 220 are arranged on the chip loading region of the base film 201, the input and output electrode pads 120in and 120out and the wiring patterns 210 and 220 may be blocked by the semiconductor chip 100 and not be seen.

The tape wiring board 200 may include a base film 201 having an insulation property and conductive wiring patterns 210 and 220. According to some embodiments, the base film 201 may be a flexible film including a polyimide having a high coefficient of thermal expansion (CTE) and excellent durability. According to some embodiments, the base film 201 may include, for example, synthetic resins such as an epoxy-based resins acrylic, polyether nitrile, polyether sulfone, polyethylene terephthalate, and/or polyethylene naphthalate.

The base film 201 may include a chip loading region (an area marked with broken lines, corresponding to the semiconductor chip 100), over which the semiconductor chip 100 is loaded, and a wiring unit, in which wiring patterns 210 and 220 are arranged on outskirts of the chip loading region. The wiring patterns 210 and 220 may be formed on the base film 201 and include conductive metal materials. For example, the wiring patterns 210 and 220 may be made of copper (Cu), but are not limited thereto. The wiring patterns 210 and 220 may be covered and protected by a protection film such as solder-resist.

The wiring patterns 210 and 220 may include input wiring patterns 210 and output wiring patterns 220. The input wiring patterns 210 may be used as a passage conveying, for example, a signal voltage transmitted by a printed circuit board, to the semiconductor chip 100. An end of each of the input wiring patterns 210 may be connected to each of the input electrode pads 120in of the semiconductor chip 100, and another end of each of the input wiring patterns 210 may be connected to each of input wiring electrodes 215.

The output wiring patterns 220 may be used as passages conveying image signals from the semiconductor chip 100 to data line of a display panel. An end of each of the output wiring patterns 220 may be connected to each of the output electrode pads 120out of the semiconductor chip 100, and another end of each of the output wiring patterns 220 may be connected to each of the output wiring electrodes 225.

Figure 10A:
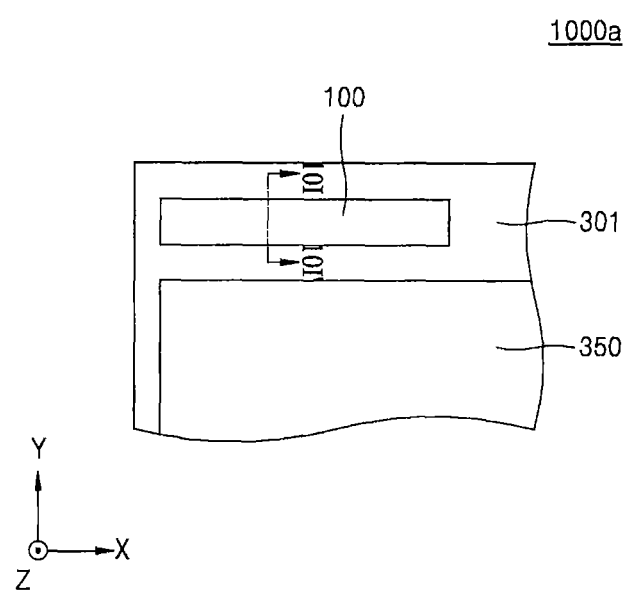
FIGS. 10A and 10B are respectively a plan view and a cross-sectional view for describing a semiconductor package including a semiconductor chip according to an embodiment of the inventive concepts.
Figure 10B:
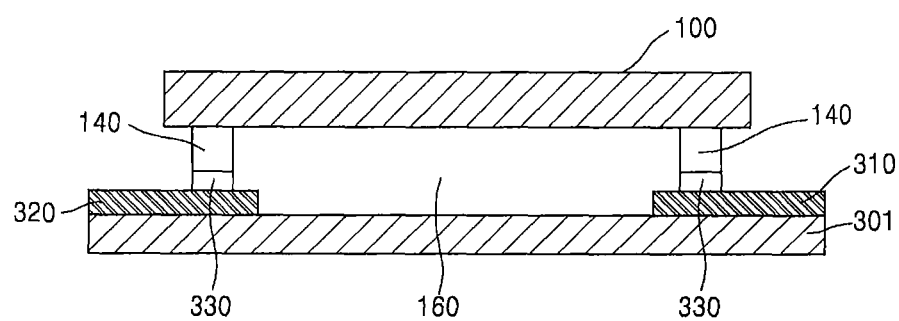

FIGS. 10A and 10B are respectively a plan view and a cross-sectional view of the semiconductor package including the semiconductor chip according to an embodiment of the inventive concepts, and FIG. 10B is a cross-sectional view taken along line 101-101' of FIG. 10A. For convenience of description, descriptions overlapping with those of FIGS. 1 through 9B are omitted, and differences will be mainly described.

Referring to FIGS. 10A and 10B, the semiconductor package 1000a may include the semiconductor chip 100 and a glass substrate 301. The semiconductor chip 100 may correspond to the semiconductor chip 100 of FIG. 4.

The semiconductor package 1000a may be implemented by a loading method that is similar to a loading method of the semiconductor package 1000 of FIG. 9A. However, while the semiconductor package 1000 uses the tape wiring board 200 as a loading board, the semiconductor package 1000a illustrated in FIGS. 10A and 10B may use the glass substrate 301. In addition, while the wiring patterns 210 and 220 made of copper are generally formed on the tape wiring board 200, wiring patterns 310 and 320 formed on transparent ITO may be formed on the glass substrate 301.

In the semiconductor package 1000 of FIG. 9A, the semiconductor chips 100 may be loaded above the tape wiring board 200, by a way of combining external connection terminals 140, which are formed under the semiconductor chips 100, On the other hand, the semiconductor package 1000 of the embodiment may, by using an adhesive conductive film (ACF) 330, load the semiconductor chip 100 above glass substrate 301.

A structure of the semiconductor package 1000 of FIG. 9A is referred to as a chip on film (COF) package structure, and a structure of the semiconductor package 1000a of FIG. 10B is referred to as a chip on glass COG package structure. In a COG package such as the semiconductor package 1000a of FIGS. 10A and 10B, the semiconductor chip 100 may, as it is illustrated, be loaded together with an LCD panel 350 above the glass substrate 301.

Figure 11:
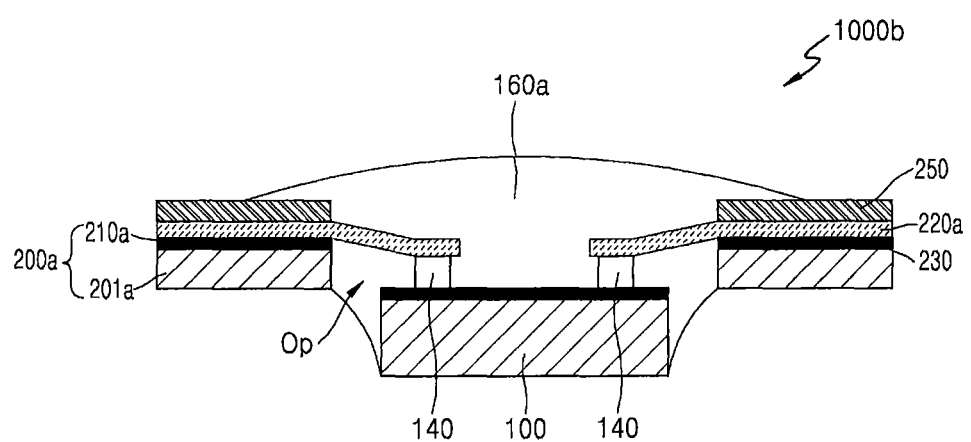
FIG. 11 is a cross-sectional view for describing a semiconductor package including a semiconductor chip according to an embodiment of the inventive concepts.

FIG. 11 is a cross-sectional view for describing a semiconductor package including the semiconductor chip according to some embodiments of the inventive concepts. For convenience of description, descriptions overlapping with those of FIGS. 1 through 10B are omitted, and differences will be mainly described.

Referring to FIG. 11, a semiconductor package 1000b according to some embodiments may include the semiconductor chip 100 and a tape carrier 200a. The semiconductor chip 100 may correspond to the semiconductor chip 100 of FIG. 4.

The semiconductor package 1000b of the embodiment, which is similar to the semiconductor package 1000 of FIG. 9A, may be different from the semiconductor package 1000 in a sense that the tape carrier 200a is used instead of the tape wiring board 200. A thickness of a base film 201a of the tape carrier 200a may be thicker than the base film 201 used in the tape wiring board 200. According to some embodiments, on the tape carrier 200a, on an area where the semiconductor chip 100 is loaded, an opening Op may be formed. Also, to make the base film 201a be bent better, a plurality of slit holes may be formed on the base film 201a.

Wiring patterns 210a and 220a are formed on the base film 201a of the tape carrier 200a, and the wiring patterns 210a and 220a may be adhered to the base film 201a by using adhesive 230. The wiring patterns 210a and 220a may be arranged in a structure protruding toward the opening Op of the base film 201a. The semiconductor chip 100 may be loaded in a flip-chip bonding method by using the external connection terminals 140 and be electrically connected to the wiring patterns 210a and 220a. As illustrated in FIG. 11, as the semiconductor chip 100 is loaded as a structure of being accommodated in the openings Op, the semiconductor chip 100 may be loaded under the wiring patterns 210a and 220a. However, the embodiment is not limited thereto, and the semiconductor chip 100 may also be loaded above the wiring patterns 210a and 220a. The semiconductor package 1000b of the embodiment, in contrast to the semiconductor package 1000 of FIG. 9A or the semiconductor package 1000a of FIG. 10A, is referred to as a tape carrier package (TCP) structure. As illustrated in FIG. 11, underfill 160a and solder-resist 250 may also be present.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the inventive concepts have been particularly shown and described with reference to embodiments thereof, it will be understood that various changes in form and details may be made therein without departing from the spirit and scope of the following claims.

What is claimed is:

1. A semiconductor chip comprising:
    a substrate comprising a circuit area having a rectangular shape and a peripheral area surrounding the circuit area;
    a key area overlapping a part of the circuit area and a part of the peripheral area;
    a plurality of drive circuit, cells in the circuit area; and,
    a conductive reference line on the peripheral area and extending in a first direction parallel to a first edge among four edges of the rectangular shape of the circuit area.

2. The semiconductor chip of claim 1, wherein a length in the first direction of the first edge of the circuit area is substantially identical to a length of the conductive reference line in the first direction.

3. The semiconductor chip of claim 1, wherein a length of the conductive reference line in the first direction is greater than a length of the key area in the first direction.

4. The semiconductor chip of claim 1, wherein the rectangular shape of the circuit area comprises a second edge, substantially perpendicular to the first direction, and
    wherein the first edge is longer than the second edge.

5. The semiconductor chip of claim 1, wherein the conductive reference line extends across an entire length of the key area.

6. The semiconductor chip of claim 1, wherein the conductive reference line comprises a plurality of conductive reference lines, and
    wherein ones of the plurality of conductive reference lines are adjacent respective edges of the circuit area that are parallel to the first direction.

7. The semiconductor chip of claim 1, further comprising:
    a plurality of electrode pads in the peripheral area between the circuit area and the conductive reference line,
    wherein the plurality of electrode pads are arranged in the first direction.

8. The semiconductor chip of claim 1, wherein the conductive reference line is closer to an outer edge of the peripheral area than the first edge.

9. The semiconductor chip of claim 1, wherein a width of the conductive reference line in a second direction that is perpendicular to the first direction is substantially uniform.

10. The semiconductor chip of claim 9, wherein the width of the conductive reference line in the second direction is wider than a width of the key area in the second direction, and
    wherein the key area comprises a plurality of alignment keys used in a photolithography process.

11. A semiconductor chip comprising:
    a substrate comprising a circuit area and a peripheral area on four sides of the circuit area;
    a key area overlapping with part of the circuit area and part of the peripheral area, wherein the key area comprises a process pattern; and
    a conductive reference line extending across the key area in the peripheral area.

12. The semiconductor chip of claim 11, wherein the substrate extends in a first direction and in a second direction that is perpendicular to the first direction,
    wherein a length of the circuit area in the first direction is greater than a length of the circuit area in the second direction, and
    wherein the conductive reference line extends in the first direction.

13. The semiconductor chip of claim 11, wherein the process pattern is between the conductive reference line and the substrate.

14. The semiconductor chip of claim 11, further comprising a plurality of conductive patterns in the circuit area,
    wherein an uppermost conductive pattern of the conductive patterns is at a substantially same level as the conductive reference line.

15. The semiconductor chip of claim 11, further comprising a plurality of electrode pads in the peripheral area and adjacent to the circuit area,
    wherein the conductive reference line and the plurality of electrode pads are at a substantially same level.

16. The semiconductor chip of claim 11, wherein the substrate further comprises:
    trenches;
    field dielectrics within the trenches; and
    an active area within an upper portion of the substrate that is defined by the field dielectrics,
    wherein a portion of the active area in the key area is surrounded, by the field dielectrics.

17. The semiconductor chip of claim 16, further comprising circuit protection structures below the conductive reference line,
    wherein the circuit protection structures comprise conductive protection patterns extending in a horizontal direction and conductive protection vias extending in a vertical direction.

18. The semiconductor chip of claim 17, wherein the conductive reference line is connected to the active area via the circuit protection structures.

19. A semiconductor package comprising:
    a semiconductor chip comprising a circuit area having a rectangular shape extending to a first length in a first direction, a plurality of electrode, pads arranged adjacent an outer circumference of the circuit area, and a conductive reference line, separated from the circuit area with the plurality of electrode pads therebetween and extending to a second length in the first direction; and a base film comprising a chip loading region where the semiconductor chip is loaded thereon and a plurality of wiring patterns electrically connected to the electrode pads.

20. The semiconductor package of claim 19, wherein the semiconductor chip is a display driver integrated circuit (DDI), wherein the semiconductor chip further comprises process patterns adjacent to a center of edges of the semiconductor chip that are parallel to the first direction, and wherein the conductive reference line is at a substantially same level as the electrode pads, and the process patterns are below the conductive reference line.

* * * * *